United States Patent
Lang

(10) Patent No.: US 11,854,829 B2
(45) Date of Patent: Dec. 26, 2023

(54) METHOD FOR STRUCTURING A SUBSTRATE

(71) Applicant: LSR Engineering & Consulting Limited, Hong Kong SAR (CN)

(72) Inventor: Marcus Elmar Lang, Chongqing (CN)

(73) Assignee: LSR Engineering & Consulting Limited, Hong Kong SAR (CN)

( * ) Notice: Subject to any disclaimer, the term of this patent is extended or adjusted under 35 U.S.C. 154(b) by 351 days.

(21) Appl. No.: 17/423,369

(22) PCT Filed: May 8, 2020

(86) PCT No.: PCT/EP2020/062843
§ 371 (c)(1),
(2) Date: Jul. 15, 2021

(87) PCT Pub. No.: WO2020/225414
PCT Pub. Date: Nov. 12, 2020

(65) Prior Publication Data
US 2022/0130680 A1    Apr. 28, 2022

(30) Foreign Application Priority Data
May 8, 2019   (DE) .................... 10 2019 112 030.6

(51) Int. Cl.
*H01L 21/768*    (2006.01)
*H01L 21/3213*   (2006.01)
(Continued)

(52) U.S. Cl.
CPC .. *H01L 21/32134* (2013.01); *H01L 21/02068* (2013.01); *H01L 21/2885* (2013.01); *H01L 21/76879* (2013.01)

(58) Field of Classification Search
CPC ......... H01L 21/32134; H01L 21/76885; H01L 21/76879; H01L 21/0272
See application file for complete search history.

(56) References Cited

U.S. PATENT DOCUMENTS 5,120,572 A  *  6/1992  Kumar ...................... H05K 1/16
                                                   430/312
2012/0064712 A1*  3/2012  Lei ......................... H01L 24/03
                                                   257/E21.589
(Continued)

FOREIGN PATENT DOCUMENTS

EP       2 549 553 A2      1/2013
WO    2015/063080 A1      5/2015
WO    2018/135325 A1      7/2018

OTHER PUBLICATIONS

International Search Report in PCT/EP2020/062843, dated Sep. 2, 2020.

*Primary Examiner* — Jaehwan Oh
(74) *Attorney, Agent, or Firm* — Collard & Roe, P.C.

(57) ABSTRACT

A method for structuring a substrate is specified, in particular structuring by means of selective etching in the semiconductor and IC substrate industry, in which the following steps are carried out: providing a substrate, applying a titanium seed layer, full-area coating with a photoresist layer, lithographic structuring of the photoresist layer, in order to expose regions of the titanium seed layer, selectively depositing copper as conductor tracks in those areas in which the titanium seed layer is exposed, removing the structured photoresist, and etching the titanium seed layer in the areas previously covered by the structured photoresist, wherein phosphoric acid is used to etch the titanium seed layer and, in addition, exposure to UV light is carried out during the etching of the titanium.

12 Claims, 2 Drawing Sheets

Figure 1A:
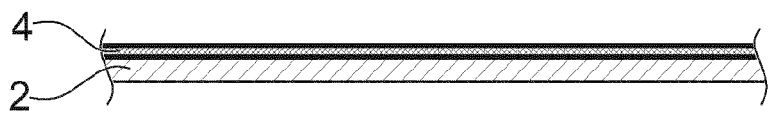

(51) Int. Cl.
*H01L 21/02* (2006.01)
*H01L 21/288* (2006.01)

(56) References Cited

U.S. PATENT DOCUMENTS

2013/0228926 A1* 9/2013 Maeda .............. H01L 29/78618
 257/751
2019/0312122 A1 10/2019 Morita et al.

* cited by examiner

METHOD FOR STRUCTURING A SUBSTRATE

CROSS REFERENCE TO RELATED APPLICATIONS

This application is the National Stage of PCT/EP2020/062843 filed on May 8, 2020, which claims priority under 35 U.S.C. § 119 of German Application No. 10 2019 112 030.6 filed on May 8, 2019, the disclosure of which is incorporated by reference. The international application under PCT article 21(2) was not published in English.

The invention relates to a method for structuring a substrate, in particular structuring by means of selective etching in the semiconductor and IC substrate industry.

It is known from the general prior art that it is possible to deposit metallic layers on insulating substrates, which are then structured by wet chemical etching. For example, substrates with copper layers are known, whereby typically a seed layer is initially deposited electrochemically in order to facilitate crystallization as a seed or nucleus. A further electrolytically deposited copper layer is then applied to the electrochemically deposited copper layer, which are then jointly structured to form the desired conductor path elements for wiring. Further process steps, such as the formation of plated through-holes (also known as vias), may also be necessary and are known to the person skilled in the art.

Typically, the structured path elements are characterized in terms of their minimum structure width and the minimum distance between them. At present, the formation of structures with a minimum structure resolution of 8 µm and a minimum distance between adjacent structures of approximately the same size is common in the substrate industry.

Following the trend of ever-increasing miniaturization, current further developments are aimed at achieving minimum structure widths or spacings in the range of 5 µm or 2 µm and smaller. For this purpose, however, it is necessary to create a corresponding further enhancement with regard to etching technology, in particular to reduce resulting undercuts during etching.

One approach could be to replace the above-mentioned seed layer with another metal in order to be able to selectively etch, which would in particular allow a reduced wet chemical attack on the deposited electrolytic copper layer.

A possible variant could be the use of titanium as a seed layer, whereby the titanium layer is typically applied to the substrate with a layer thickness of 300 nm or less. In known processes, the titanium layer is then etched with hydrofluoric acid or with an alkaline solution, i.e. especially sodium hydroxide (NaOH) or potassium hydroxide (KOH), often in combination with hydrogen peroxide.

However, both processes, i.e. etching titanium with hydrofluoric acid as well as in an alkaline solution, are dependent on the exchange of the solution between the structures and also have a major disadvantage in terms of process technology in that extremely dangerous process conditions are created. In addition to the highly corrosive effect, which could have a negative impact on the machines used, but also on the operating personnel and the environment, there is also a risk of explosion through sudden decomposition of individual reaction components, which is particularly important when using KOH.

From EP 2 549 553 A2 an LED module and a corresponding manufacturing process is known, in which the LED module has several ground planes formed on an insulating layer. The insulating layer can be provided as oxidized silicon, for example. A seed layer is applied to the insulating layer, which has titanium or gold as starting layer.

It is accordingly an object of the invention to create a process for structuring a substrate, in particular structuring by means of selective etching in the semiconductor and IC substrate industry, which is easier to control with respect to the process conditions than the processes known from the state of the art and, in addition, allows structure resolutions below 2 µm.

This object is achieved by the features of claim 1. Further advantageous embodiments of the invention are the subject matter of the dependent claims. These can be combined in a technologically meaningful way. The description, in particular in connection with the drawing, additionally characterizes and specifies the invention.

According to the invention, a method for structuring a substrate is specified, in particular structuring by means of selective etching in the semiconductor and IC substrate industry, in which the following steps are carried out:
  providing a substrate,
  applying a titanium seed layer on the substrate,
  depositing a photoresist layer on the entire surface of the substrate with the titanium seed layer,
  lithographic structuring of the photoresist layer, in order to expose regions of the titanium seed layer,
  selectively depositing copper as conductor tracks in those areas in which the titanium seed layer is exposed,
  removing the structured photoresist, and
  etching the titanium seed layer in the areas previously covered by the structured photoresist, wherein phosphoric acid is used to etch the titanium seed layer and, in addition, exposure to UV light is carried out during the etching of the titanium.

Accordingly, etching of the titanium seed layer by means of a phosphoric acid in an aqueous solution is used, which is additionally influenced by exposure to UV light, so that etching selective to the copper material of the conductor tracks can be carried out. This method produces significantly fewer undercuts, so that smaller track widths and distances between the tracks can be achieved.

According to one embodiment of the invention, the titanium seed layer has a layer thickness of 100 to 300 nm and is produced by deposition from the gas phase, preferably by sputtering.

This allows simple application of the titanium seed layer on almost all known substrates.

According to a further embodiment of the invention, the copper layer is applied by electroplating.

The copper layer can be applied directly between the areas covered by the structured photoresist to define the conductor track structures.

According to a further embodiment of the invention, UV light has a wavelength of 300 nm or less. Typically, a UV lamp or a UV laser with a wavelength of 185 nm, 254 nm or a combination of both wavelengths can be used.

Due to the irradiation with UV light, oxygen or ozone is generated in the etching solution. Furthermore, the UV light causes an activation of the titanium, especially by oxidation to titanium oxide, which allows a direct chemical reaction in the diffusion layer, thus minimizing the need for solution exchange. Furthermore, the UV light supports dissociating of OH from the phosphoric acid, so that the split-off OH group supports the etching of titanium.

According to a further embodiment of the invention, a high-pressure rinsing process is applied after etching.

Accordingly, a purging or rinsing process is carried out in a high-pressure purge in order to increase the process reliability and to be able to dispense with still adhering titanium compounds.

According to a further embodiment of the invention, etching of the titanium seed layer is carried out by immersion in a tank with phosphoric acid or by spraying with phosphoric acid.

Accordingly, the etching process can be carried out in different ways, i.e. by static or moving immersion as well as by spraying, which creates a wide range of applications.

According to a further embodiment of the invention, an additional oxidizing agent is added.

According to a further embodiment of the invention, the oxidizing agent is added in liquid form, preferably as hydrogen peroxide, or in gaseous form, preferably as oxygen or ozone.

According to a further embodiment of the invention, the oxidizing agent is added as a starter when the solution is newly prepared or is again in use after a longer holding time.

According to a further embodiment of the invention, the additional oxidizing agent is added to accelerate the process.

The addition of the additional oxidizing agent makes it possible to use the solution with the phosphoric acid as a starter for a new preparation or after a longer holding life. Furthermore, it is also possible to use the additional oxidizing agent to accelerate the process.

According to a further embodiment of the invention, an additional ultrasound treatment is carried out.

Particularly in the case of immersion application, this can improve the removal of the used material or loosen still adhering titanium compounds.

According to a further embodiment of the invention, the solvent together with the phosphoric acid is fed to a suction device.

In immersion and spraying applications, the installation of one or more suction devices could improve the flow and thus the solution exchange in very fine structures on the substrate. The combination of spraying or streaming (during immersion) and solution extraction generates a flow on the surface of the structures and promotes the exchange of solution.

Figure 1B:
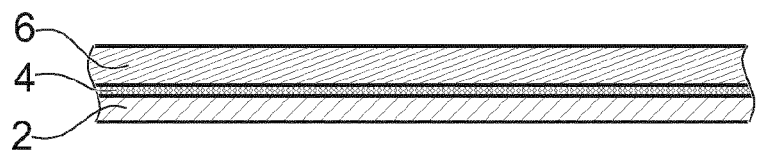
Figure 1C:
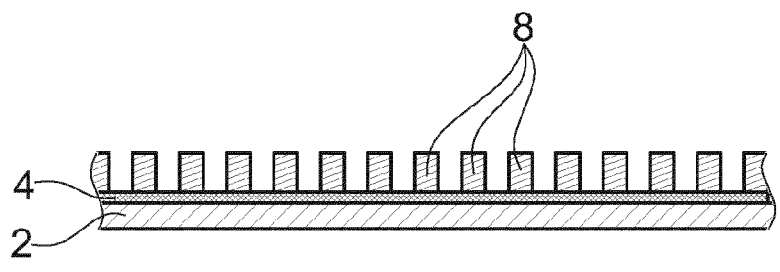
Figure 1D:
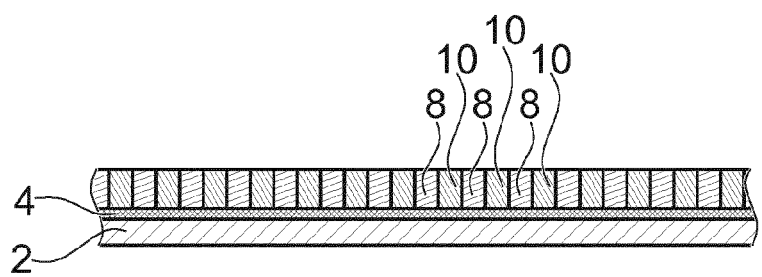
Figure 1E:
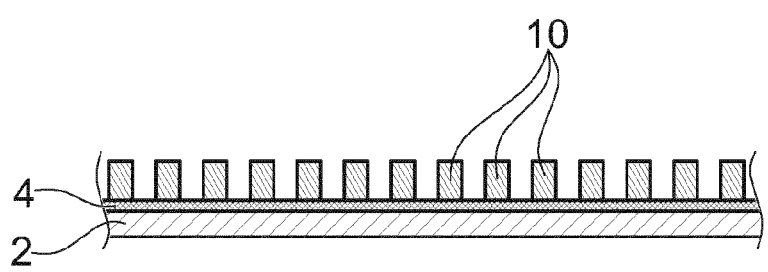
Figure 1F:
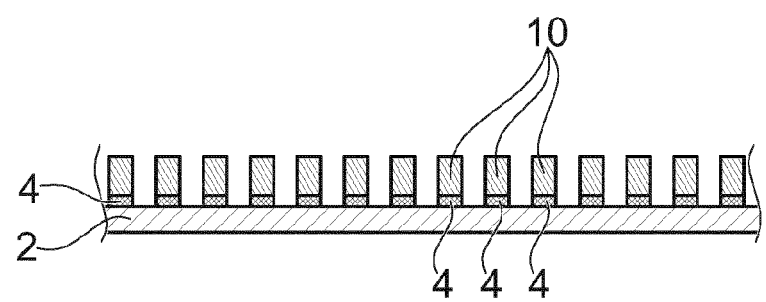
Figure 2:
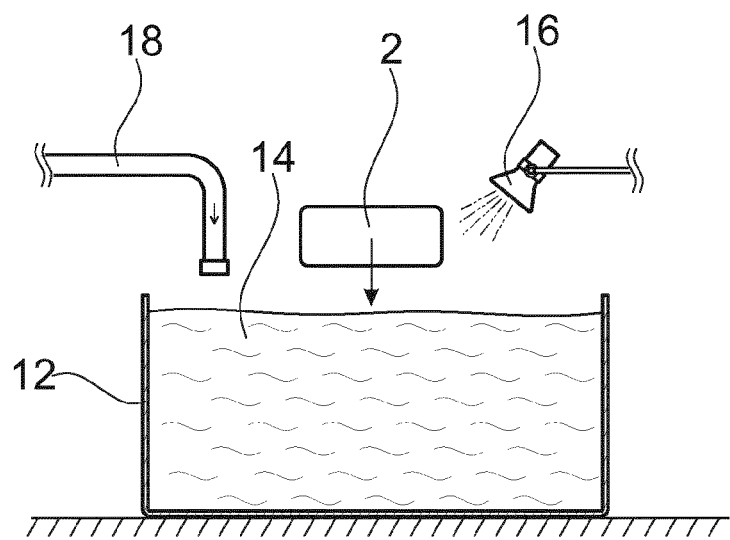
Figure 3:
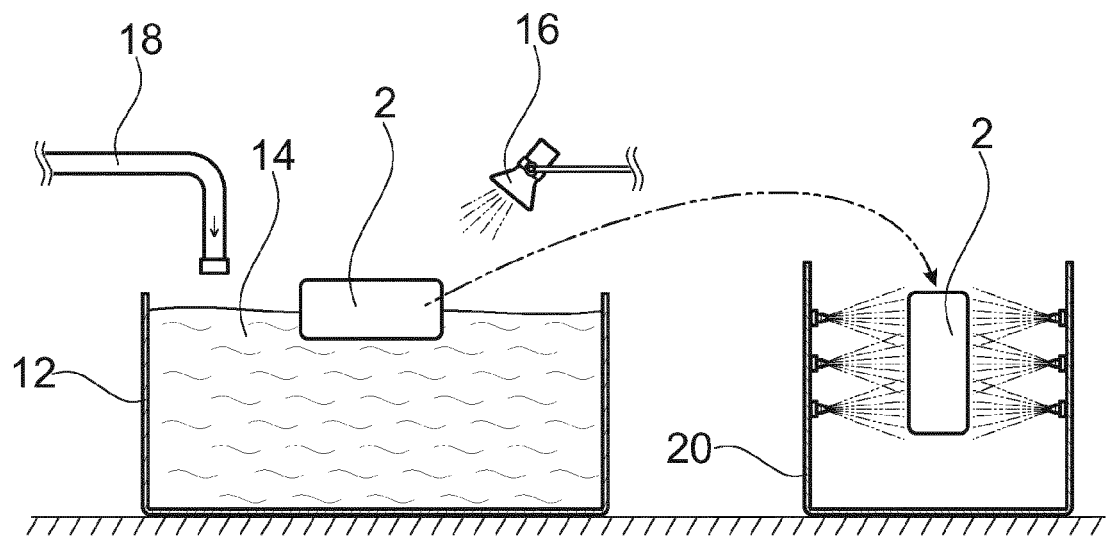

Some embodiments are explained in more detail below with reference to the drawings. In the drawings:

FIG. 1A-F show individual process steps during the structuring of a conductive surface of a substrate by means of the method according to the invention in a side view, FIG. 2 shows a first device for performing the method according to the invention in a side view, and FIG. 3 shows a second device for performing the method according to the invention in a side view.

In the figures, the same or functionally equivalent components are provided with the same reference numerals.

In the following, with reference to FIGS. 1A to 1F, a first embodiment of the invention is described in more detail, which is suitable, for example, for the production of structured conductive surfaces for substrates on which integrated circuits are mounted.

As shown in FIG. 1A, a titanium seed layer 4 is first deposited on a substrate 2. The titanium seed layer 4 usually is formed with a thickness of 300 nm or less and is produced on the substrate 2 by sputtering. The titanium seed layer 4 will be referred to as the seed layer in the following.

FIG. 1B shows that a photoresist layer 6 is now applied over the entire surface of the titanium seed layer 4 on the side facing away from the substrate 2, which can usually be achieved by spinning or laminating. However, other methods known to persons skilled in the art for applying a photoresist layer 6 over an entire area are not excluded.

As shown in FIG. 1C, the photoresist layer 6 is subsequently structured or patterned by means of a lithographic exposure, so that after a usually wet chemical development step the full area photoresist layer 6 is converted into a structured photoresist 8 with a multitude of structural elements. The remaining part of the structured photoresist 8 corresponds in later application to those positions which lie outside those which are to be provided with conductive tracks on the substrate 2. It goes without saying, therefore, that the structured photoresist 8 can also be formed with other, in particular irregular patterns, which can deviate greatly from the design shown only symbolically in FIG. 1C.

In a subsequent process step, copper is selectively introduced above the titanium seed layer 4 in the areas not covered by the structured photoresist 8, which is usually done by electroplating. The tracks are marked with the reference symbol 10 in FIG. 1D.

In the next process step, shown in FIG. 1E, the structured photoresist 8 is removed. As a result, the areas between the tracks 10, which are formed by the copper material, are now exposed, so that the titanium seed layer 4 outside the tracks 10 is now exposed. In the areas previously covered by the patterned photoresist 8, the titanium seed layer is now removed by etching, whereby phosphoric acid is used to etch the titanium seed layer 4, so that etching selective to the copper material of the conductor tracks 10 can be performed. Such a procedure produces significantly fewer undercuts, so that smaller track widths and distances between the tracks can be achieved.

With reference to FIG. 2, the etching step shown in FIG. 1F is explained again with more detail. It can be depicted that the substrate 2 is placed in an immersion tank 12 filled with the phosphoric acid, where the substrate can be held either statically at rest or can be moved in the immersion tank 12. In another variant, not shown in FIG. 2, it would also be possible to spray the surface of the substrate with the phosphoric acid.

The phosphoric acid is present as an aqueous solution at a given concentration, as shown in FIG. 2 by the liquid level indicated by the reference sign 14. In addition, during the etching process, UV light is applied to the titanium seed layer 4 by means of a UV lamp 16, which can emit UV light with a wavelength of 185 nm, 254 nm or a combination of these two wavelengths.

The task of this irradiation with UV light from UV lamp 16 is to generate oxygen or ozone in the etching solution. Furthermore, the UV light causes an activation of the titanium, especially by oxidation to titanium oxide, which enables a direct chemical reaction in the diffusion layer, thus minimizing the need for solution exchange. Furthermore, the UV light supports dissociation or splitting off the OH part from the phosphoric acid, so that the split-off OH group supports the etching of titanium.

According to the invention, the UV lamp 16 can irradiate the surface of the substrate 2 directly but can also be used indirectly in the immersion basin 12, since even then OH is still split off and oxygen or ozone is generated. The effect of indirect irradiation may be worse but sufficient for this application. The term "exposure with UV light" is therefore generally understood to mean the use of UV light, regardless of whether it is directed directly at the surface or not.

FIG. 2 also shows a further embodiment of the invention. Here, in addition to wet chemical etching in phosphoric acid, an oxidizing agent is added, which can be supplied either in liquid or gaseous form as hydrogen peroxide, oxygen or ozone.

The addition of the additional oxidizing agent is indicated schematically in FIG. 2 by the feed line 18. The task of the oxidizing agent is to serve as a starter for the solution with the phosphoric acid when a new solution is prepared or when it is to be used after a longer period of holding time. Furthermore, it is also possible to use the additional oxidizing agent to accelerate the process.

Subsequently, as indicated in FIG. 3 by the rinsing device 20, a rinsing or purging process is carried out in a high-pressure purge to increase process reliability, in order to be able to loosen any titanium compounds still adhering. This process step is typically optional and will be required depending on the desired application.

Optionally, titanium could be better removed from small structures by means of ultrasound in the immersion application. Especially with cyclical switching on and off, the solution exchange in very fine structures could be improved.

In immersion and spray applications, the installation of additional suction devices could further improve the flow and thus the solution exchange in very fine structures of conductor elements 10. The combination of spraying or flowing (in immersion) and solution extraction generates a flow at the surface or structures and promotes the exchange of solutions.

The process steps of the inventive method as explained in connection with FIGS. 1 to 3 are considerably less dangerous compared to those known in the prior art and, in particular acts directly on the surface to be etched. Experiments have shown that structural elements with a resolution of less than 2 μm can be realized with it.

The features indicated above and in the claims, as well as the features which may be seen in the figures, may be advantageously implemented both individually as well as in various combinations. The invention is not limited to the exemplary embodiments described but may be modified in many ways within the scope of expert knowledge.

LIST OF REFERENCE NUMERALS 2 substrate
4 titanium seed layer
6 photoresist layer
8 structured photoresist
10 conductor tracks
12 immersion tank
14 Liquid level
16 UV lamp
18 feed line
20 rinsing device

The invention claimed is:

1. A method for structuring a substrate, in particular structuring by means of selective etching in the semiconductor and IC substrate industry, in which the following steps are carried out:
   providing a substrate,
   applying a titanium seed layer on the substrate,
   depositing a photoresist layer on the entire surface of the substrate with the titanium seed layer,
   lithographic structuring of the photoresist layer, in order to expose regions of the titanium seed layer,
   selectively depositing copper as conductor tracks in those areas in which the titanium seed layer is exposed,
   removing the structured photoresist, and
   etching the titanium seed layer in the areas previously covered by the structured photoresist, wherein phosphoric acid is used to etch the titanium seed layer and, in addition, exposure to UV light is carried out during the etching of the titanium.

2. The method according to claim 1, in which the titanium seed layer has a layer thickness of 100 to 300 nm and is produced by deposition from the gas phase, preferably by sputtering.

3. The method according to claim 1, in which the copper layer is applied by electroplating.

4. The method according to claim 1, in which the UV light has a wavelength of 300 nm or less, preferably 185 nm, 254 nm or a combination of both wavelengths.

5. The method according to claim 1, in which a high-pressure rinsing process is applied after etching.

6. The method according to claim 1, in which the etching of the titanium seed layer is carried out by immersion in a tank with phosphoric acid or by spraying with phosphoric acid.

7. The method according to claim 1 in which an additional oxidizing agent is added.

8. The method according to claim 7, in which the oxidizing agent is added in liquid form, preferably as hydrogen peroxide or in gaseous form, preferably as oxygen or ozone.

9. The method according to claim 7, in which the oxidizing agent is added as a starter when a solution is newly prepared or has been used after a longer period of holding time.

10. The method according to claim 7, in which the additional oxidizing agent is added to accelerate the process.

11. The method according to claim 1, in which an ultrasound treatment is additionally carried out.

12. The method according to claim 1, in which the solvent is fed to a suction device together with the phosphoric acid.

* * * * *